United States Patent
Hirai et al.

(10) Patent No.: US 9,438,281 B2
(45) Date of Patent: Sep. 6, 2016

(54) DISTORTION-COMPENSATION DEVICE AND DISTORTION-COMPENSATION METHOD

(71) Applicant: Panasonic Corporation, Osaka (JP)

(72) Inventors: Yoshito Hirai, Kanagawa (JP); Kouji Okamoto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/655,156

(22) PCT Filed: Nov. 29, 2013

(86) PCT No.: PCT/JP2013/007042
§ 371 (c)(1),
(2) Date: Jun. 24, 2015

(87) PCT Pub. No.: WO2014/103174
PCT Pub. Date: Jul. 3, 2014

(65) Prior Publication Data
US 2015/0349814 A1    Dec. 3, 2015

(30) Foreign Application Priority Data

Dec. 26, 2012  (JP) .................................. 2012-282742

(51) Int. Cl.
*H04K 1/02* (2006.01)
*H04L 25/03* (2006.01)
(Continued)

(52) U.S. Cl.
CPC .......... *H04B 1/0475* (2013.01); *H03F 1/3247* (2013.01); *H03F 1/3288* (2013.01);
(Continued)

(58) Field of Classification Search
CPC ................... H04B 1/10; H04B 1/0475; H04B 2001/0425; H04L 25/03012; H03F 1/3247; H03F 2201/3233; H03F 3/24
See application file for complete search history.

(56) References Cited

U.S. PATENT DOCUMENTS 6,122,610 A *  9/2000 Isabelle ............... G10L 21/0208
                                                    381/94.2
8,472,503 B2 *  6/2013 Goldberg ............... G01S 19/24
                                                    375/142

(Continued)

FOREIGN PATENT DOCUMENTS

JP         09-069733 A     3/1997
JP       2001-345718 A    12/2001

(Continued)

OTHER PUBLICATIONS

International Search Report for Application No. PCT/JP2013/007042 dated Jan. 28, 2014.

*Primary Examiner* — Hirdepal Singh
*Assistant Examiner* — Amneet Singh
(74) *Attorney, Agent, or Firm* — Pearne & Gordon LLP

(57) ABSTRACT

Disclosed is a distortion compensation apparatus that, by appropriately generating a distortion-compensation coefficient, makes it possible to obtain a desired transmission output, and substantially reduce the amount of power leakage to an adjacent channel. Reception section (103) of the distortion compensation apparatus acquires and demodulates a transmission signal to generate a demodulation signal. Delay adjustment section (104) computes the delay amount of the demodulation signal with respect to the baseband signal, eliminates the delay of the demodulation signal with respect to the baseband signal based on the delay amount, and outputs the baseband signal and the demodulation signal in which the delay is eliminated. Distortion compensation section (101) determines a distortion compensation coefficient in an adaptive digital predistortion process based on the baseband signal and the demodulation signal output by delay adjustment section (104), and multiplies the input signal by the distortion compensation coefficient.

7 Claims, 9 Drawing Sheets

(51) Int. Cl.
*H04L 25/49* (2006.01)
*H04B 1/04* (2006.01)
*H03F 1/32* (2006.01)
*H03F 3/24* (2006.01)

(52) U.S. Cl.
CPC ............... *H03F 3/24* (2013.01); *H04B 1/04* (2013.01); *H03F 2201/3233* (2013.01); *H04B 2001/0425* (2013.01)

(56) References Cited

U.S. PATENT DOCUMENTS

| | | | |
|---|---|---|---|
| 8,909,061 B1* | 12/2014 | Varadarajan | ....... H04B 10/6161 398/159 |
| 2001/0051504 A1 | 12/2001 | Kubo et al. | |
| 2004/0022302 A1* | 2/2004 | Olson | ................... G01S 5/0215 375/148 |
| 2004/0232986 A1 | 11/2004 | Hirose et al. | |
| 2008/0130798 A1 | 6/2008 | Ohba et al. | |
| 2009/0111117 A1* | 4/2009 | Chung | ............... G01N 33/5438 435/6.11 |
| 2010/0327971 A1 | 12/2010 | Kumagai | |
| 2011/0222630 A1 | 9/2011 | Suzuki et al. | |

FOREIGN PATENT DOCUMENTS

| | | |
|---|---|---|
| JP | 2010-183633 A | 8/2010 |
| JP | 2011-010107 A | 1/2011 |
| JP | 2011-091499 A | 5/2011 |
| JP | 2011-188321 A | 9/2011 |
| WO | 2007/013177 A1 | 2/2007 |

* cited by examiner

| BASEBAND SIGNAL OUTPUT BY DELAY ADJUSTMENT SECTION | | DEMODULATION SIGNAL OUTPUT BY DELAY ADJUSTMENT SECTION | | INITIAL PHASE |
|---|---|---|---|---|
| I COMPONENT | Q COMPONENT | I COMPONENT | Q COMPONENT | |
| NEGATIVE | NEGATIVE | NEGATIVE | NEGATIVE | 0 |
| NEGATIVE | NEGATIVE | NEGATIVE | POSITIVE | $\pi/2$ |
| NEGATIVE | NEGATIVE | POSITIVE | NEGATIVE | $3\pi/2$ |
| NEGATIVE | NEGATIVE | POSITIVE | POSITIVE | $\pi$ |
| NEGATIVE | POSITIVE | NEGATIVE | NEGATIVE | $3\pi/2$ |
| NEGATIVE | POSITIVE | NEGATIVE | POSITIVE | 0 |
| NEGATIVE | POSITIVE | POSITIVE | NEGATIVE | $\pi$ |
| NEGATIVE | POSITIVE | POSITIVE | POSITIVE | $\pi/2$ |
| POSITIVE | NEGATIVE | NEGATIVE | NEGATIVE | $\pi/2$ |
| POSITIVE | NEGATIVE | NEGATIVE | POSITIVE | $\pi$ |
| POSITIVE | NEGATIVE | POSITIVE | NEGATIVE | 0 |
| POSITIVE | NEGATIVE | POSITIVE | POSITIVE | $3\pi/2$ |
| POSITIVE | POSITIVE | NEGATIVE | NEGATIVE | $\pi$ |
| POSITIVE | POSITIVE | NEGATIVE | POSITIVE | $3\pi/2$ |
| POSITIVE | POSITIVE | POSITIVE | NEGATIVE | $\pi/2$ |
| POSITIVE | POSITIVE | POSITIVE | POSITIVE | 0 |

FIG. 7

DISTORTION-COMPENSATION DEVICE AND DISTORTION-COMPENSATION METHOD

TECHNICAL FIELD

The present disclosure relates to a distortion compensation apparatus and a distortion compensation method that compensate for distortion of a signal output from a circuit that modulates and amplifies an input signal.

BACKGROUND ART

Conventionally, it is known that non-linear signal distortion is generated in an analog circuit, an RF (Radio Frequency) circuit and the like making up a transmitting system such as a radio communication device. To compensate for such signal distortion, a technique called adaptive digital predistortion has been developed.

In this technique, the reverse characteristics of an analog circuit and an RF circuit are stored in a LUT (Look Up Table) in the form of compensation coefficients in accordance with the amplitude and the power of the input signal. With this configuration, distortion compensation is achieved by preliminarily multiplying an undistorted baseband signal by a compensation coefficient corresponding to the amplitude and the power of the input signal.

In addition, in this technique, the input signal and the transmission signal multiplied by the compensation coefficients are compared with each other, and the compensation coefficients are adaptively updated such that the difference between the input signal and the transmission signal is reduced. In this manner, even in the case where the distortion characteristics are changed under the influence of aging change, temperature change, voltage change and the like, compensation of signal distortion is effectively executed.

For example, PTL 1 discloses a technique in which a compensation coefficient for compensating for signal distortion is generated by an adaptive algorithm based on a difference between an input signal and an output signal of an amplifier, and an input signal is multiplied by the compensation coefficient thus generated, whereby signal distortion generated by the amplifier is compensated.

CITATION LIST

Patent Literature

PTL 1
Japanese Patent Application Laid-Open No. 9-69733

SUMMARY OF INVENTION

Technical Problem

In the above-described technique disclosed in PTL 1 has a problem that, even when distortion compensation is performed, a desired transmission output cannot be obtained, and it is difficult to considerably reduce to the amount of power leakage to an adjacent channel.

One reason for this is that, in the technique disclosed in PTL 1, a delay with respect to an input signal is caused in the output signal used for calculating a difference, and therefore even if a compensation coefficient is generated based on the difference between the input signal and the output signal in that state, compensation coefficients are not appropriately generated.

An object of the present disclosure is to provide a distortion compensation apparatus and a distortion compensation method which can obtain a desired transmission output by appropriately generating a distortion-compensation coefficient, and can considerably reduce the amount of power leakage to an adjacent channel.

Solution to Problem

A distortion compensation apparatus of an embodiment of the present disclosure compensates for distortion of an output signal from a circuit for modulating and amplifying an input signal, and includes: a demodulation section that acquires the output signal, and generates a demodulation signal by demodulating the output signal; a delay adjustment section that computes a delay amount of the demodulation signal with respect to the input signal, eliminates a delay of the demodulation signal with respect to the input signal based on the delay amount, and outputs an input signal and a demodulation signal in which the delay is eliminated; a distortion compensation section that determines a distortion compensation coefficient in an adaptive digital predistortion process based on an input signal and an demodulation signal output by the delay adjustment section; and a multiplication section that multiplies the input signal by a distortion compensation coefficient determined by the distortion compensation section.

A distortion compensation method of an embodiment of the present disclosure is intended for compensating for distortion of an output signal from a circuit for modulating and amplifying an input signal, the method including: acquiring the output signal to generate a demodulation signal by demodulating the output signal; computing a delay amount of the demodulation signal with respect to the input signal to eliminate a delay of the demodulation signal with respect to the input signal based on the delay amount, and to output an input signal and a demodulation signal in which the delay is eliminated; determining a distortion compensation coefficient in an adaptive digital predistortion process based on an input signal and a demodulation signal which are output; and multiplying the input signal by the distortion compensation coefficient.

Advantageous Effects of Invention

According to the present disclosure, by appropriately generating a distortion-compensation coefficient, a desired transmission output can be obtained, and the amount of power leakage to an adjacent channel can be considerably reduced.

BRIEF DESCRIPTION OF DRAWINGS

FIG. 7 is an explanatory diagram of a method of determining an initial value of convergence calculation;

DESCRIPTION OF EMBODIMENTS

In the following, an embodiment of the present disclosure will be described in detail with reference to the accompanying drawings.

Figure 1:
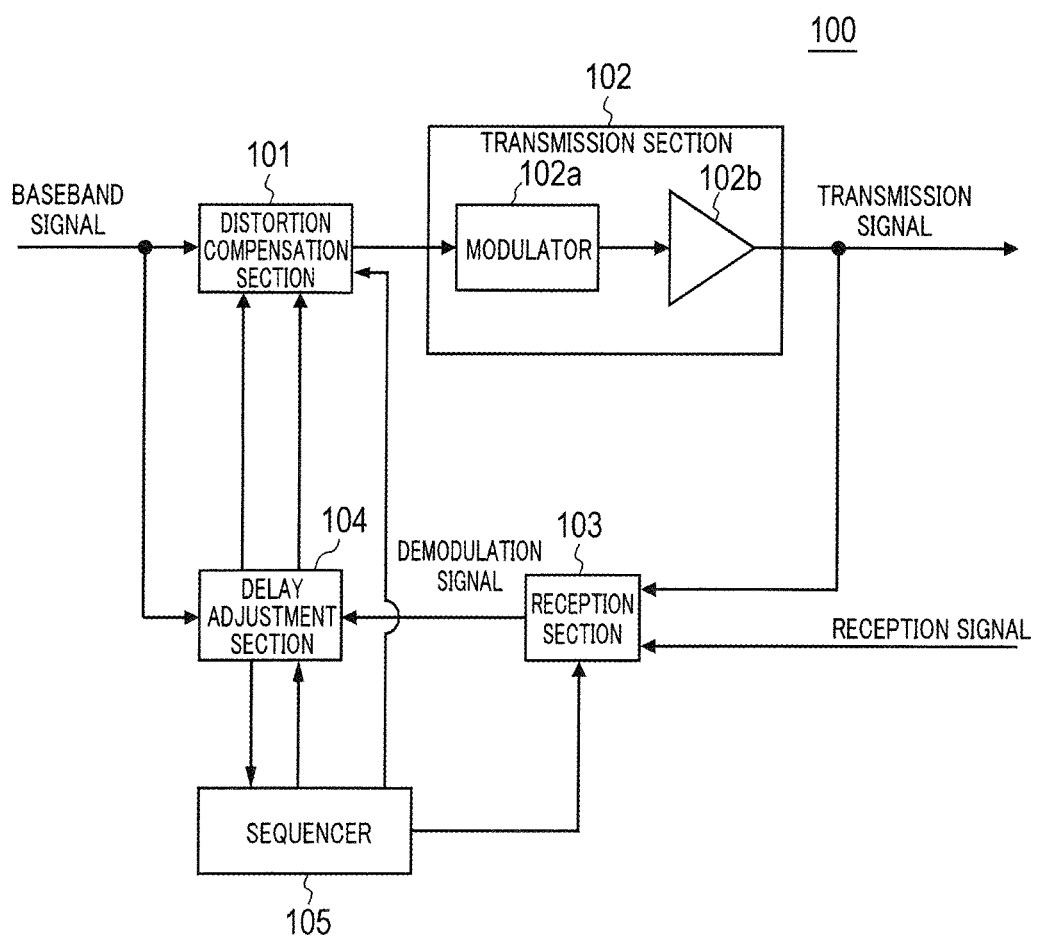
FIG. 1 is a block diagram illustrating an exemplary configuration of a communication apparatus according to the present embodiment.

FIG. 1 is a block diagram illustrating an exemplary configuration of communication apparatus 100 according to the present embodiment. Communication apparatus 100 includes distortion compensation section 101, transmission section 102, reception section 103, delay adjustment section 104, and sequencer 105.

Distortion compensation section 101 compensates for distortion of a transmission signal generated in transmission section 102 that modulates and demodulates a baseband signal. To be more specific, distortion compensation section 101 utilizes an adaptive-digital predistortion technique to compensate for the above-mentioned distortion by preliminarily multiplying an undistorted baseband signal by a compensation coefficient corresponding to the power of an input signal.

The compensation coefficient is stored in distortion compensation section 101 and is adaptively updated based on a baseband signal and a transmission signal. Distortion compensation section 101 will be described in detail later.

Transmission section 102 performs a modulation process and an amplification process on a baseband signal which has been subjected to distortion compensation by distortion compensation section 101, and outputs a resulting signal to an antenna (not illustrated) as a transmission signal to radiate a radio wave from the antenna.

Transmission section 102 includes modulator 102*a* and power amplifier 102*b*. Modulator 102*a* modulates a baseband signal output from distortion compensation section 101. Power amplifier 102*b* amplifies a modulated baseband signal.

During a transmission period in which communication apparatus 100 transmits a signal, reception section 103 acquires a transmission signal output by transmission section 102 in accordance with a request from sequencer 105 described later. Then, reception section 103 performs a demodulation process and a gain conversion process on the acquired transmission signal.

The gain conversion process is a process of converting the gain of a transmission signal such that a signal level of the transmission signal corresponds to a baseband signal input to distortion compensation section 101. Then, reception section 103 outputs the transmission signal which has been subjected to the demodulation of the gain conversion to delay adjustment section 104. The signal output from reception section 103 in this manner is hereinafter referred to as "demodulation signal."

In addition, during a reception period in which communication apparatus 100 receives signals transmitted from other apparatuses, reception section 103 acquires the received signal in accordance with a request from sequencer 105 described later, and performs a demodulation process and the like on the acquired received signal. Thereafter, the received signal thus demodulated is utilized in accordance with the use.

When communication apparatus 100 transmits a transmission signal, delay adjustment section 104 compares a baseband signal input to distortion compensation section 101 with a demodulation signal output from reception section 103, to thereby compute the delay amount of the demodulation signal with respect to the baseband signal. Then, based on the delay amount, delay adjustment section 104 eliminates the delay of the demodulation signal with respect to the baseband signal, and outputs the input signal and the demodulation signal to distortion compensation section 101 in the state where the delay is eliminated.

Then, with use of the baseband signal and the demodulation signal output by the above-described delay adjustment section 104, distortion compensation section 101 performs distortion compensation. Thus, since there is no delay between the baseband signal and the demodulation signal input to distortion compensation section 101, a distortion-compensation coefficient can be appropriately generated. The configuration of delay adjustment section 104 will be described in detail later.

During a period in which a signal is transmitted, sequencer 105 outputs a control signal for requesting to acquire a transmission signal output by transmission section 102 to reception section 103 so that reception section 103 acquires the transmission signal. In addition, during a period in which a signal is received, sequencer 105 outputs a control signal for requesting to acquire a received signal to reception section 103 so that reception section 103 acquires the received signal.

Generally, a radio communication system includes two systems, a transmission system and a reception system, and during a transmission period in which a signal is transmitted, the power of the reception system is normally turned OFF. When distortion compensation is performed, it is necessary to acquire a transmission signal during the transmission period and to demodulate the acquired transmission signal; however, when such a task is performed by reception section 103 of the reception system, the circuit size can be advantageously reduced. For this reason, in the present embodiment, the above-described configuration is employed and sequencer 105 is used, whereby signal acquirement sources can be switched.

In addition, sequencer 105 controls the activation of distortion compensation section 101 and delay adjustment section 104. To be more specific, when the power of communication apparatus 100 is turned ON, sequencer 105 activates delay adjustment section 104 to perform delay adjustment. In this manner, a compensation coefficient can be appropriately determined at an early stage.

Further, sequencer 105 detects whether the outputs of a baseband signal and a demodulation signal from delay adjustment section 104 have been brought into a steady state, and, when the outputs have been brought into a steady state, activates distortion compensation section 101 to start a process of determining a distortion compensation coefficient.

In this manner, as described later, it is possible to improve convergence characteristics of a distortion compensation coefficient in the case where distortion compensation section 101 determines a distortion compensation coefficient with use of the LMS (Least Mean Square) method.

Figure 2:
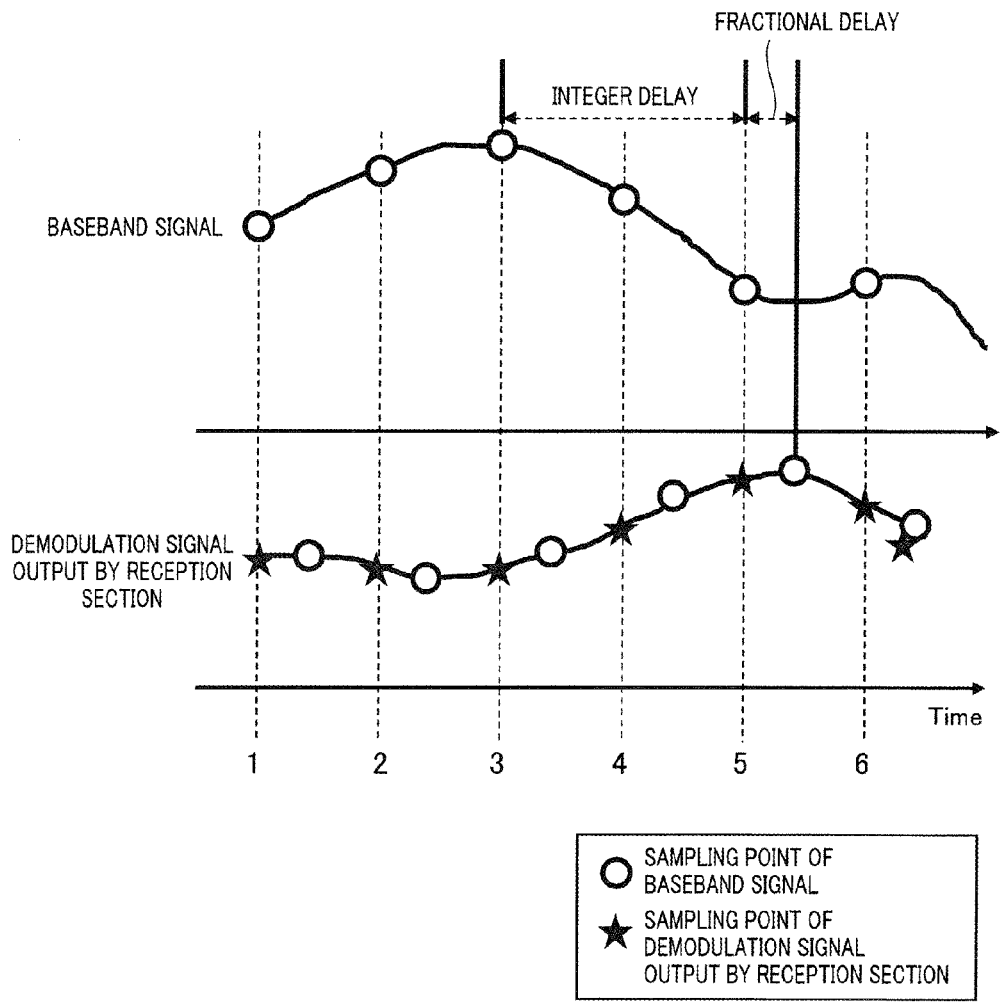
FIG. 2 is an explanatory diagram of a state of a signal delay.

Next, a signal delay adjusted by delay adjustment section 104 is described in detail. FIG. 2 is an explanatory diagram of a state of a signal delay. FIG. 2 shows a baseband signal input to distortion compensation section 101 and a power of a demodulation signal output from reception section 103. Here, transmission section 102 and reception section 103 operate with the same clock, and therefore the sampling timings of the baseband signal and the demodulation signal coincide with each other.

As illustrated in FIG. 2, an integer delay and a fractional delay are generated between a baseband signal sampled by transmission section 102 and a demodulation signal output by reception section 103. The integer delay is a sampling delay and is generated mainly in a digital circuit, and the fractional delay is an analog delay and is generated in an analog circuit, an RF circuit, and the like.

When such delays are generated, distortion compensation cannot be correctly performed, and therefore it is important to eliminate such delays. For this reason, based on the output powers of a baseband signal and a demodulation signal, delay adjustment section 104 detects and eliminates the above-described delays.

Figure 3:
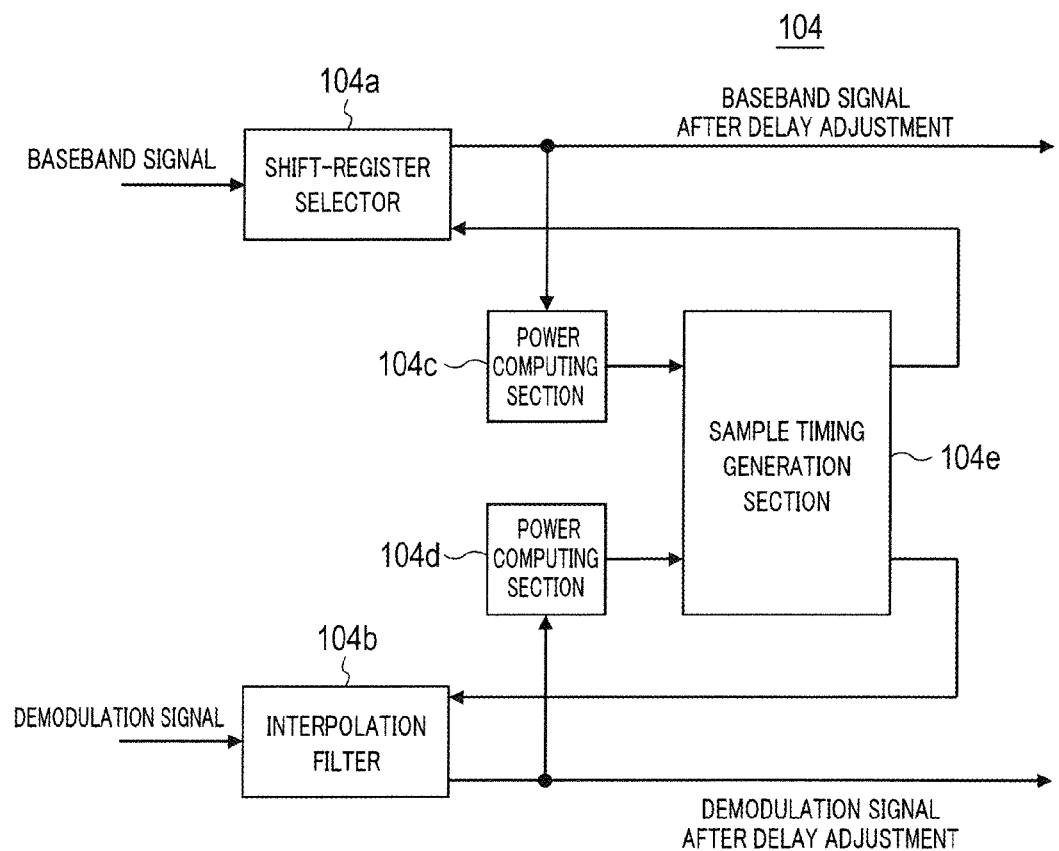
FIG. 3 is a block diagram illustrating an exemplary configuration of a delay adjustment section illustrated in FIG. 1.

FIG. 3 is a block diagram illustrating an exemplary configuration of delay adjustment section 104 illustrated in FIG. 1. Delay adjustment section 104 includes shift-register selector 104a, interpolation filter 104b, power computing sections 104c and 104d, and sample timing generation section 104e.

Shift-register selector 104a is a delay step composed of a plurality of shift registers and selectors. Shift-register selector 104a delays a baseband signal by each shift register, and outputs to distortion compensation section 101 a baseband signal delayed by steps designated by a control signal output from sample timing generation section 104e. In this manner, the integer delay shown in FIG. 2 can be eliminated.

Interpolation filter 104b generates a demodulation signal which is shifted by a phase designated by a control signal output from sample timing generation section 104e. In this manner, the fractional delay shown in FIG. 2 can be eliminated.

Power computing section 104c computes the output power of a baseband signal which has been output by shift-register selector 104a and has been subjected to delay adjustment, and outputs information of the computed output power to sample timing generation section 104e. Power computing section 104d computes the output power of a demodulation signal output by interpolation filter 104b, and outputs information of the computed output power to sample timing generation section 104e.

Sample timing generation section 104e computes an error between the output power computed by power computing section 104c and the output power computed by power computing section 104d, and detects the delay amount of the demodulation signal which minimizes the error.

As illustrated in FIG. 2, the output power of a demodulation signal has a waveform substantially similar to that of the output power of a baseband signal except for the delay. Therefore, by computing the above-mentioned error, the delay amount of a demodulation signal with respect to a baseband signal can be detected.

Sample timing generation section 104e outputs information of an integer part of the delay amount as an integer delay which is exemplified in FIG. 2 to shift-register selector 104a. In the example illustrated in FIG. 2, the integer delay is "2," and a baseband signal delayed by two steps is output to shift-register selector 104a.

In addition, sample timing generation section 104e outputs information of a fractional part of the delay amount as a fractional delay which is exemplified in FIG. 2 to interpolation filter 104b. In this case, the demodulation signal which is exemplified in FIG. 2 is output in the state where it is shifted forward by the amount of the fractional delay by interpolation filter 104b.

Through the above-mentioned processes, a delay of the demodulation signal with respect to the baseband signal can be eliminated, and distortion compensation can be appropriately performed.

It is to be noted that, while a delay is eliminated based on the output power of the baseband signal and the output power of the demodulation signal in this case, a delay can be eliminated by computing an error between the amplitude of a baseband signal and the amplitude of a demodulation signal, and by using an delay amount which minimizes the error.

Here, a baseband signal and a demodulation signal have phase information since they are complex signals. Further, in a baseband signal, phase rotation occurs in the course of being output through transmission section 102 and reception section 103 as a demodulation signal. As described below, such phase rotation is a factor that degrades the reception performance of a reception apparatus.

Figure 4:
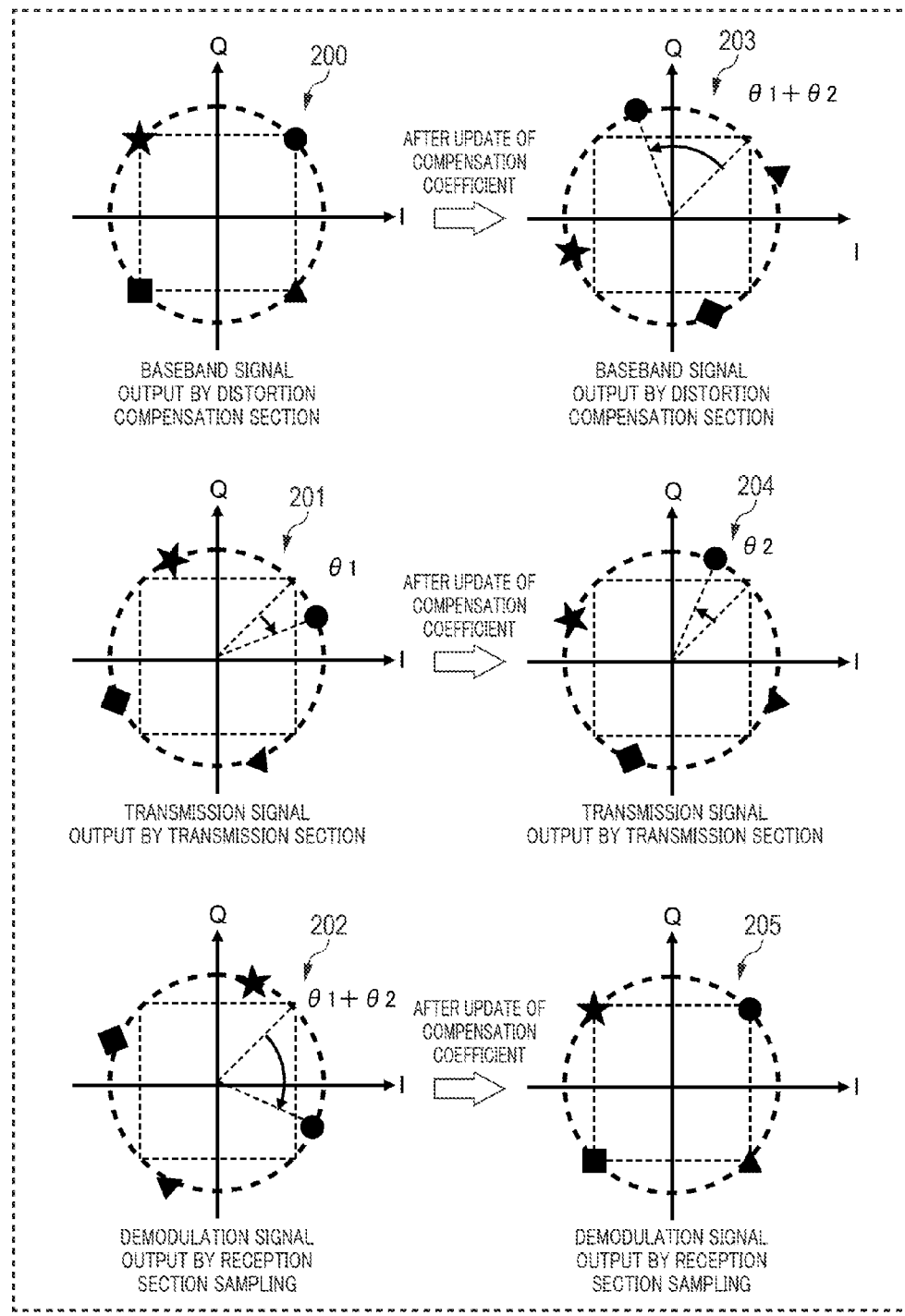
FIG. 4 is an explanatory diagram of phase rotation.

FIG. 4 shows explanatory diagrams of phase rotation. FIG. 4 shows constellation diagrams of the case where QPSK modulation is performed to transmit a signal.

Constellation diagram 200 of FIG. 4 is a constellation diagram of a baseband signal output from distortion compensation section 101 at the start of signal transmission. Constellation diagram 201 is a constellation diagram of a transmission signal output from transmission section 102 at the start of signal transmission. Constellation diagram 202 is a constellation diagram of a demodulation signal output from reception section 103 at the start of signal transmission.

Further, constellation diagram 203 is a constellation diagram of a baseband signal output from distortion compensation section 101 after the compensation coefficient for compensating for distortion of a transmission signal is updated. Constellation diagram 204 is a constellation diagram of a transmission signal output from transmission section 102 after the compensation coefficient is updated. Constellation diagram 205 is a constellation diagram of a demodulation signal output from reception section 103 after the compensation coefficient is updated.

As shown in constellation diagram 201, the phase of a transmission signal output from transmission section 102 at the start of transmission is rotated by angle $\theta_1$ with respect to the phase of the baseband signal at the start of transmission which is shown in constellation diagram 200.

In addition, as shown in constellation diagram 202, the phase of a demodulation signal output from reception section 103 at the start of transmission is rotated by angle $\theta_1+\theta_2$ with respect to the phase of the baseband signal at the start of transmission which is shown in constellation diagram 200.

Therefore, when a compensation coefficient is updated in this state, a compensation coefficient is determined and updated such that the phase of the demodulation signal shown in constellation diagram 205 coincides with the phase of the baseband signal shown in constellation diagram 200.

As a result, the phase of the baseband signal shown in constellation diagram 200 is rotated counterclockwise by $\theta_1+\theta_2$ as shown in constellation diagram 203. Likewise, the phase of the transmission signal shown in constellation diagram 201 is rotated counterclockwise by $\theta_1+\theta_2$ as shown in constellation diagram 204.

When a phase is changed by determination of the compensation coefficient in this manner, the base of the phase of a transmission signal is changed, and the reception performance of the reception apparatus is degraded. Therefore, as described below, distortion compensation section 101 illustrated in FIG. 1 adjusts a phase such that the base of the phase of a transmission signal is not changed.

Figure 5:
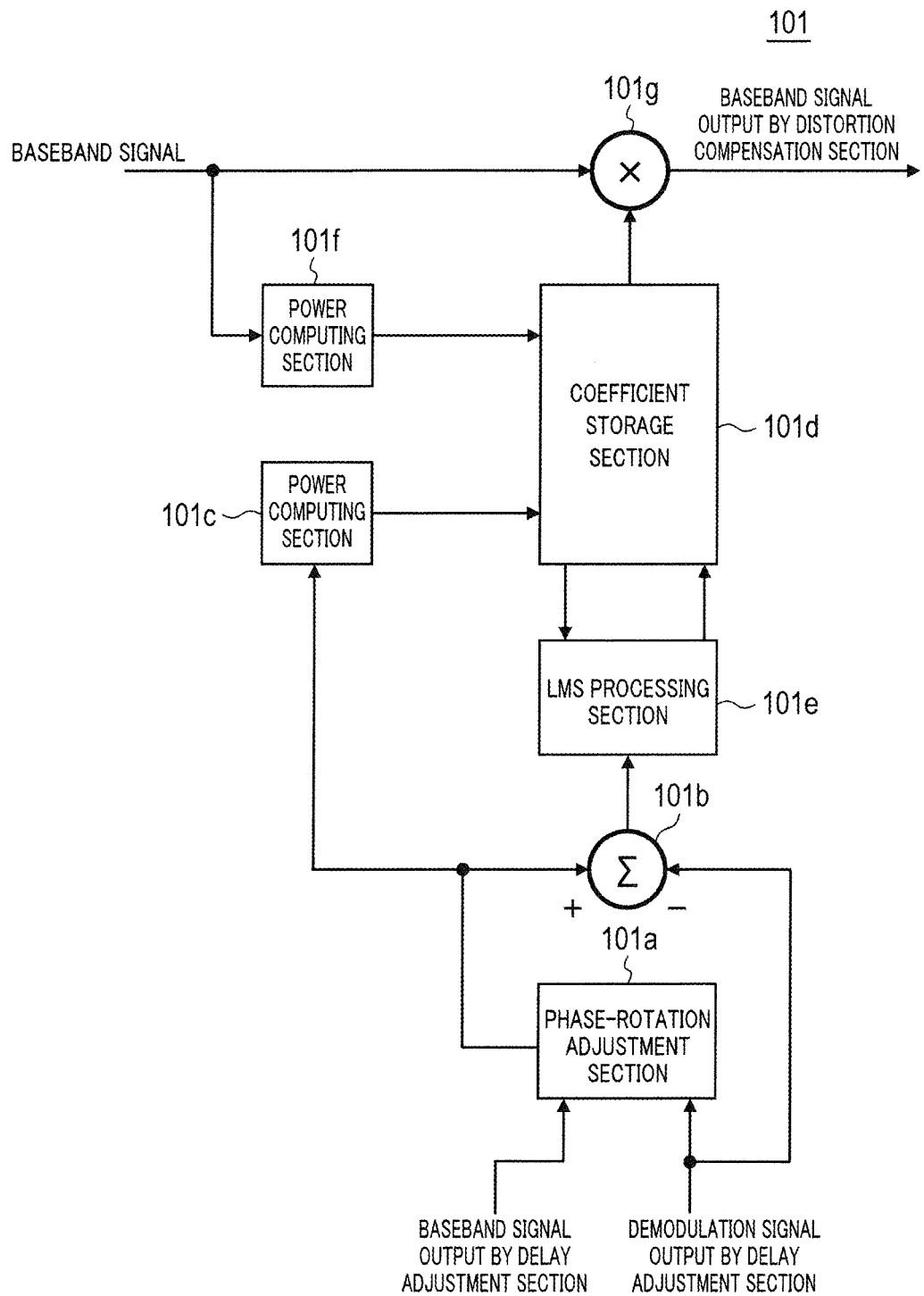
FIG. 5 is a block diagram illustrating an exemplary configuration of a distortion compensation section illustrated in FIG. 1.

FIG. 5 is a block diagram illustrating an exemplary configuration of distortion compensation section 101 illustrated in FIG. 1. Distortion compensation section 101 includes phase-rotation adjustment section 101a, subtractor 101b, power computing section 101c, coefficient storage section 101d, LMS processing section 101e, power computing section 101f, and complex multiplier 101g.

Phase-rotation adjustment section 101a eliminates a phase difference resulting from phase rotation caused between a baseband signal and a demodulation signal output by delay adjustment section 104 illustrated in FIG. 1. With such a configuration, when distortion compensation is further performed as described below, it is possible to prevent the phase of the transmission signal shown in constellation diagram 201 of FIG. 4 from being changed to the phase of the transmission signal shown in constellation diagram 204. It is to be noted that the configuration of phase-rotation adjustment section 101a will be described in detail later.

Subtractor 101b computes error $e_t$ ($=x_t-y_t$) between baseband signal $x_t$ and demodulation signal $y_t$ whose phase difference is eliminated by phase-rotation adjustment section 101a.

Power computing section 101c computes the output power of the baseband signal output by phase-rotation adjustment section 101a. Then, power computing section 101c generates an address corresponding to the computed output power, and outputs the generated address to coefficient storage section 101d described next.

Coefficient storage section 101d includes a storage device such as a memory. Coefficient storage section 101d is formed as a LUT (Look Up Table) that stores compensation coefficient $A_i$ (i=1 to n) for use in complex multiplication of a baseband signal.

From among the compensation coefficients stored therein, coefficient storage section 101d outputs a compensation coefficient corresponding to the address computed by power computing section 101c to LMS processing section 101e. In addition, from among the compensation coefficients stored therein, coefficient storage section 101d outputs a compensation coefficient corresponding to the address computed by power computing section 101f described later to complex multiplier 101g.

LMS processing section 101e uses information of error $e_t$ output by subtractor 101b to update compensation coefficient $A_i$ stored in coefficient storage section 101d. Compensation coefficient $A_i$ is stored in coefficient storage section 101d at an address corresponding to the output power computed by power computing section 101c.

To be more specific, demodulation signal $y_t$ is represented as:

$$y_t = A_i x_t f$$

where f is a function that represents an influence of distortion generated in transmission section 102 illustrated in FIG. 1.

LMS processing section 101e performs convergence calculation with use of a widely accepted LMS (Least Mean Square) method to determine the value of compensation coefficient $A_i$ such that the absolute value of error $e_t$, that is, $$e_t = x_t - y_t$$

is a small value.

Then, with use of the value of compensation coefficient $A_i$ thus determined, LMS processing section 101e updates the value of compensation coefficient $A_i$ stored in coefficient storage section 101d.

Power computing section 101f computes the output power of an input baseband signal. Then, power computing section 101f generates an address corresponding to the computed output power, and outputs the generated address to coefficient storage section 101d.

Complex multiplier 101g performs complex multiplication of an input baseband signal with a compensation coefficient stored in coefficient storage section 101d at an address generated by power computing section 101f, and outputs the resulting signal to transmission section 102 illustrated in FIG. 1.

Figure 6:
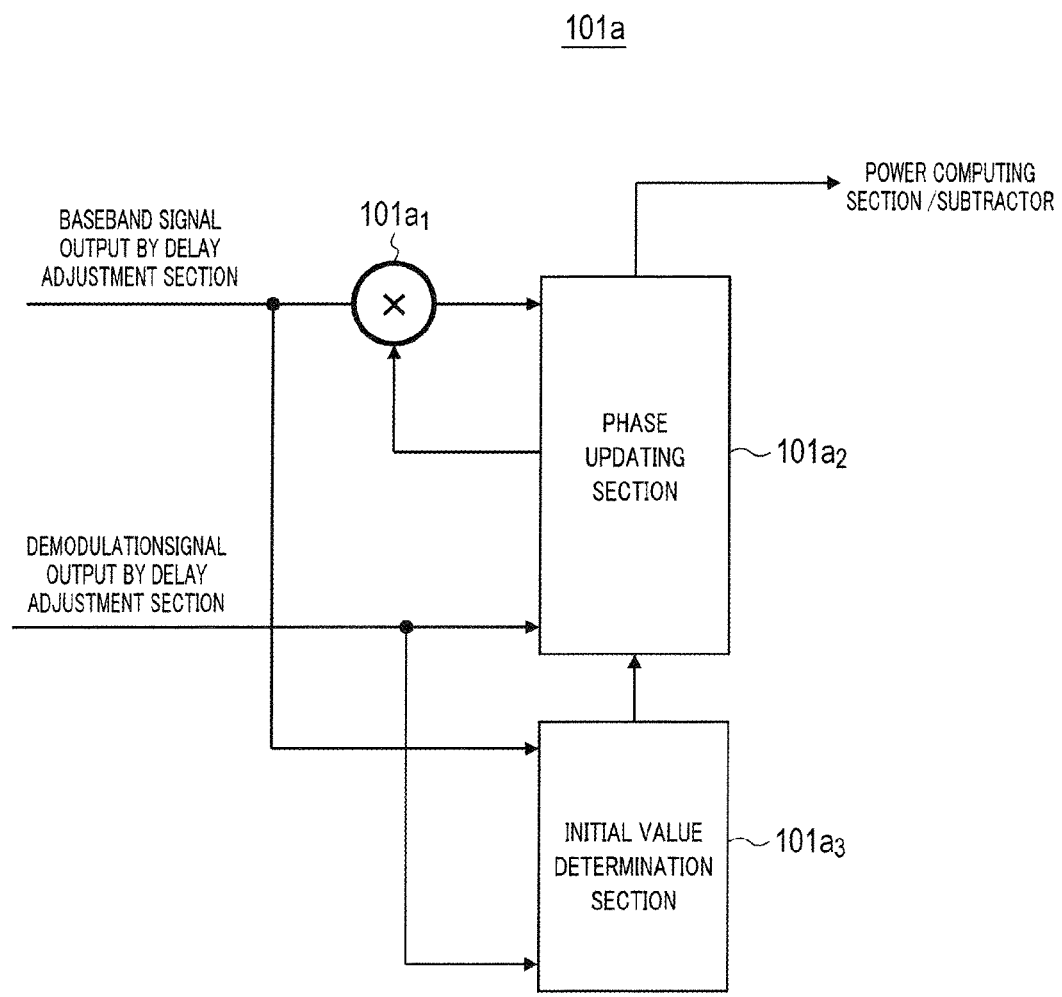
FIG. 6 is a block diagram illustrating an exemplary configuration of a phase-rotation adjustment section illustrated in FIG. 5.

Next, an exemplary configuration of phase-rotation adjustment section 101a illustrated in FIG. 5 is described. FIG. 6 is a block diagram illustrating an exemplary configuration of phase-rotation adjustment section 101a illustrated in FIG. 5. Phase-rotation adjustment section 101a includes complex multiplier $101a_1$, phase updating section $101a_2$, and initial value determination section $101a_3$.

Complex multiplier $101a_1$ multiplies a baseband signal output by delay adjustment section 104 illustrated in FIG. 1 by correction signal $e^{-i\theta}$ output by phase updating section $101a_2$ described later, and outputs the resulting signal to phase updating section $101a_2$. Correction signal $e^{-i\theta}$ rotates the phase of a baseband signal clockwise by angle θ on the constellation diagram.

Phase updating section $101a_2$ computes error $\theta_e$ between phase $\theta_b$ of a baseband signal multiplied by a correction signal by complex multiplier $101a_1$, and phase $\theta_d$ of a demodulation signal output by delay adjustment section 101a illustrated in FIG. 1. Then, phase updating section $101a_2$ performs convergence calculation with use of a widely accepted LMS method to determine the value of θ such that the absolute value of error $\theta_e$, that is, $$\theta_e = \theta_b - \theta_d$$

is a small value.

In this manner, a phase shift caused by phase rotation between a baseband signal and a demodulation signal is eliminated. Then, phase updating section $101a_2$ outputs a baseband signal from which a phase shift is eliminated to power computing section 101c and subtractor 101b illustrated in FIG. 5.

Initial value determination section $101a_3$ determines the initial value of θ in convergence calculation performed by phase updating section $101a_2$. To be more specific, initial value determination section $101a_3$ determines the initial value of θ based on information of the polarities of the in-phase component and the quadrature component of the baseband signal output by delay adjustment section 104 illustrated in FIG. 1, and on information of the polarities of the in-phase component and the quadrature component of the demodulation signal output by the delay adjustment section (the quadrant on the constellation diagram to which the baseband signal and the demodulation signal belong).

FIG. 7 shows a method of determining an initial value in convergence calculation. For example, when the I component and the Q component of the baseband signal are both negative (third quadrant of the constellation diagram), and the I component and the Q component of the demodulation signal are both negative (third quadrant of the constellation diagram), the value of error $\theta_e$ can be recognized to be close to 0, and therefore initial value determination section $101a_3$ determines that the initial value of θ is 0.

In addition, when the I component and the Q component of the baseband signal are both negative (third quadrant of the constellation diagram), and the I component and the Q component of the demodulation signal are negative and positive, respectively (second quadrant of the constellation diagram), the value of error $\theta_e$ can be recognized to be close to $\pi/2$, and therefore initial value determination section $101a_3$ determines that the initial value of $\theta$ is $\pi/2$.

Further, when the I component and the Q component of the baseband signal are both negative (third quadrant of the constellation diagram), and the I component and the Q component of demodulation signal are positive and negative, respectively (fourth quadrant of the constellation diagram), the value of error $\theta_e$ can be recognized to be close to $3\pi/2$, and therefore initial value determination section $101a_3$ determines that the initial value of $\theta$ is $3\pi/2$.

In addition, when the I component and the Q component of the baseband signal are both negative (third quadrant of the constellation diagram), and the I component and the Q component of the demodulation signal are both positive (first quadrant of the constellation diagram), the value of error $\theta_e$ can be recognized to be close to $\pi$, initial value determination section $101a_3$ determines that the initial value of $\theta$ is $\pi$. Likewise, the initial values of $\theta$ of the other cases are set.

By determining the initial value of $\theta$ in this manner, the convergence speed in convergence calculation at the time when a phase shift is eliminated can be considerably increased.

Next, procedures of a distortion compensation process according to the present embodiment will be described. It is to be noted that the following describes the case where delay adjustment by delay adjustment section 104 and phase rotation adjustment by distortion compensation section 101 are performed at the time when communication apparatus 100 is activated. Such processes are effective for the case where components of communication apparatus 100 are not easily influenced by temperature change and power source variation. Thus, the power consumption of the entire communication apparatus 100 can be reduced.

Figure 8:
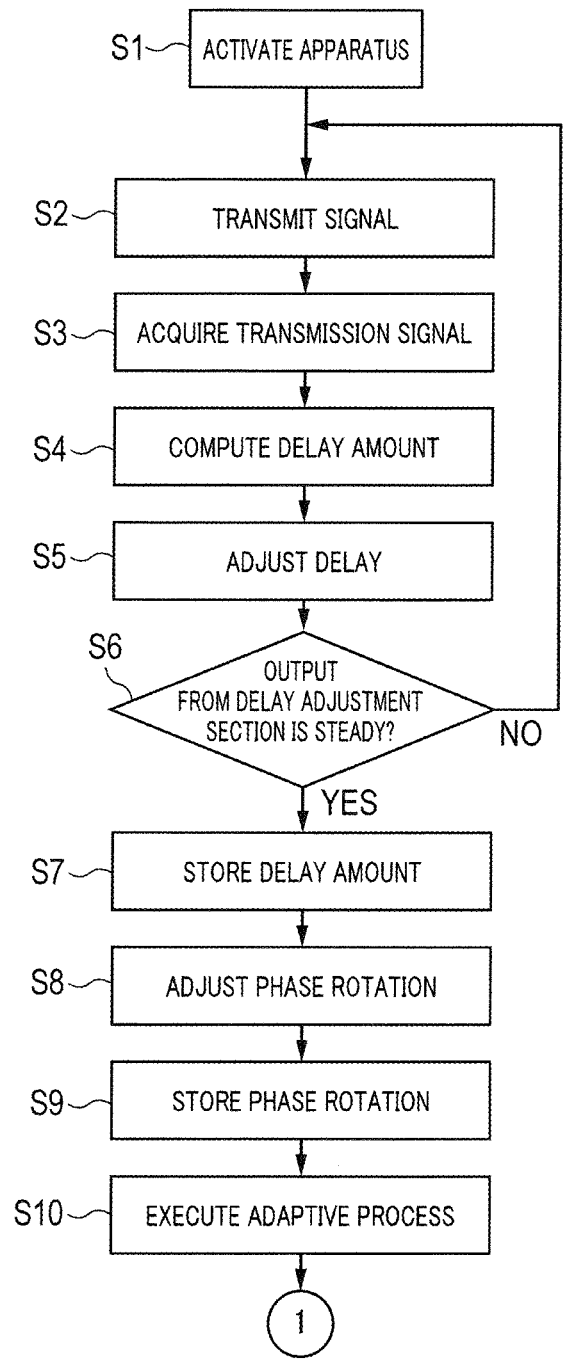
FIG. 8 is a flowchart illustrating exemplary procedures of a distortion compensation process according to the present embodiment.
Figure 9:
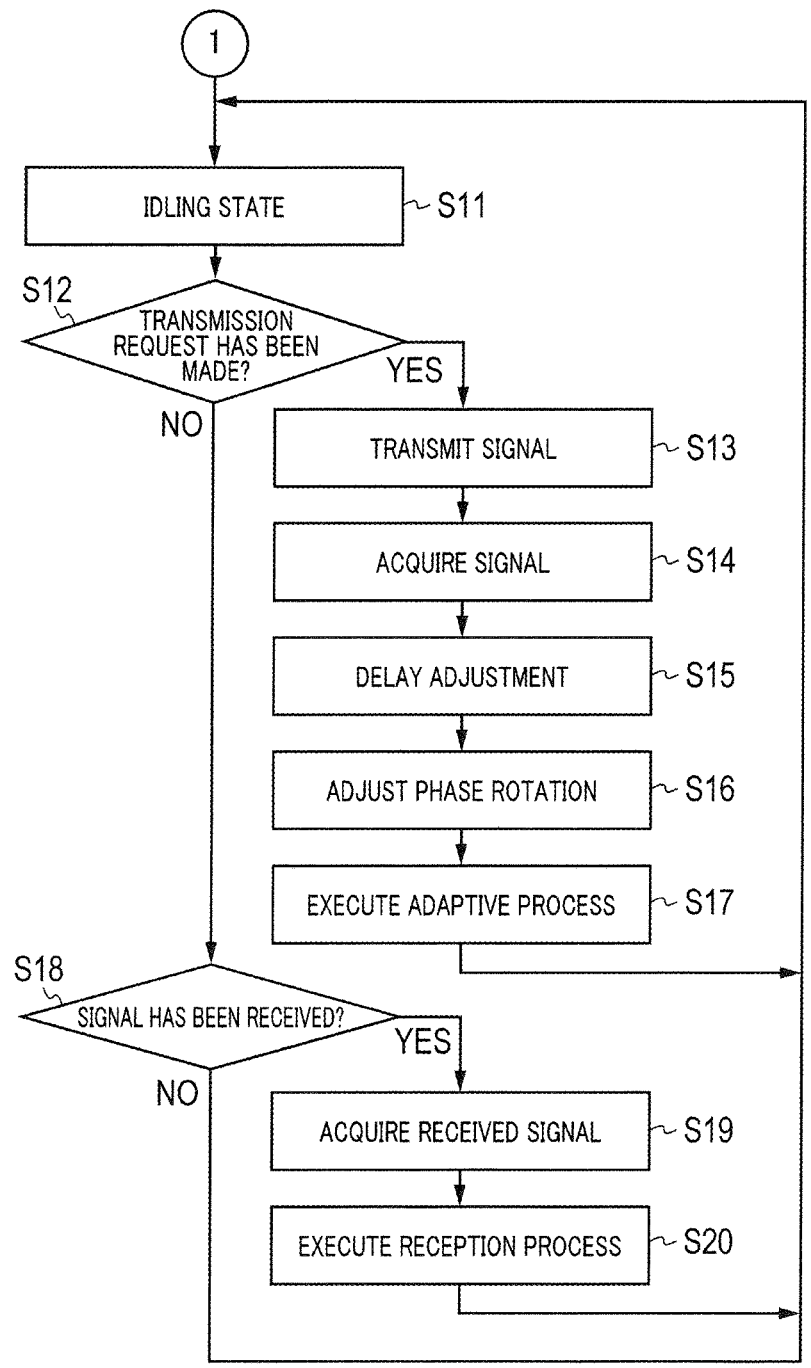
FIG. 9 is a flowchart illustrating exemplary procedures of a distortion compensation process according to the present embodiment.

FIG. 8 and FIG. 9 are flowcharts of exemplary procedures of the distortion compensation process according to the present embodiment. First, when the power of communication apparatus 100 is turned ON, communication apparatus 100 is activated (step S1).

When communication apparatus 100 is activated, transmission section 102 transmits a signal such as a control signal to other communication apparatuses such as a base station (step S2). At this time, sequencer 105 activates reception section 103, and reception section 103 acquires transmission signal (step S3).

Further, sequencer 105 activates delay adjustment section 104, and delay adjustment section 104 eliminates the delay of a demodulation signal with respect to a baseband signal, whereby the delay amount of the demodulation signal with respect to the baseband signal is computed (step S4). Then, delay adjustment section 104 performs delay adjustment for delaying the baseband signal and the demodulation signal by the computed delay amount (step S5).

Thereafter, sequencer 105 determines whether the outputs of the baseband signal and the demodulation signal from delay adjustment section 104 have been brought into a steady state (step S6). When it is determined that the outputs have not been brought into a steady state (step S6: NO), the processes subsequent to step S2 are executed.

When it is determined that the outputs have been brought into a steady state (step S6: YES), delay adjustment section 104 stores information of the delay amounts of the baseband signal and the demodulation signal resulting from the delay adjustment in a memory or the like (step S7).

Thereafter, sequencer 105 activates distortion compensation section 101, and distortion compensation section 101 computes a phase difference caused by phase rotation between the baseband signal and the demodulation signal. Then, distortion compensation section 101 adjusts the phase of the baseband signal by the difference to eliminate the phase shift (step S8).

Further, distortion compensation section 101 stores the computed phase difference in a memory or the like (step S9). Then, distortion compensation section 101 uses the baseband signal and the demodulation signal from which the phase shift is eliminated to execute an adaptive digital predistortion process (step S10).

Thereafter, as illustrated in FIG. 9, communication apparatus 100 is brought into an idling state (step S11). Then, sequencer 105 determines whether a signal transmission request has been made (step S12).

When it is determined that a signal transmission request has been made (step S12: YES), transmission section 102 transmits a signal to other communication apparatuses (step S13). At this time, sequencer 105 activates reception section 103, and reception section 103 acquires a transmission signal (step S14).

Then, sequencer 105 activates delay adjustment section 104, and delay adjustment section 104 reads out the information of the delay amount stored at step S7 of FIG. 8 and performs delay adjustment for delaying the baseband signal and the demodulation signal by the delay amount (step S15).

Subsequently, sequencer 105 activates distortion compensation section 101, and distortion compensation section 101 reads out the information of the phase difference stored at step S9 of FIG. 8 and adjusts the baseband signal phase by the phase difference (step S16), to thereby eliminate the phase shift caused by phase rotation.

Thereafter, distortion compensation section 101 uses the baseband signal and the demodulation signal from which the phase shift is eliminated to execute the adaptive digital predistortion process (step S17). Thereafter, the processes subsequent to step S11 are executed.

On the other hand, when it is determined at step S12 that no signal transmission request has been made (step S12: NO), sequencer 105 determines whether a signal has been received from other communication apparatuses such as a base station and the like (step S18).

When it is determined that a signal has been received (step S18: YES), sequencer 105 activates reception section 103, and, based on the request of sequencer 105, reception section 103 acquires the received signal (step S19). Then, reception section 103 executes a reception process such as demodulation (step S20). Thereafter, processes subsequent to step S11 are executed.

When it is determined at step S18 that no signal has been received (step S18: NO), the processes subsequent to step S11 are executed.

While the delay adjustment by delay adjustment section 104, and the phase rotation adjustment by distortion compensation section 101 are performed at the time when communication apparatus 100 is activated, the delay adjustment and the phase rotation adjustment may be performed at timings other than the time when communication apparatus 100 is activated. For example, the delay adjustment and the phase rotation adjustment may be performed every time when a signal transmission period is reached.

This application is entitled to and claims the benefit of Japanese Patent Application No. 2012-282742 dated Dec. 26, 2012, the disclosure of which including the specification, drawings and abstract is incorporated herein by reference in its entirety.

INDUSTRIAL APPLICABILITY

The distortion compensation apparatus and the distortion compensation method according to the present disclosure are suitable for a distortion compensation apparatus and a distortion compensation method that compensate for distortion of a signal output from a circuit that modulates and amplifies an input signal.

REFERENCE SIGNS LIST

100 Communication apparatus
101 Distortion compensation section
101a Phase-rotation adjustment section
$101a_1$ Complex multiplier
$101a_2$ Phase updating section
$101a_3$ Initial value determination section
101b Subtractor
101c Power computing section
101d Coefficient storage section
101e LMS processing section
101f Power computing section
101g Complex multiplier
102 Transmission section
102a Modulator
102b Power amplifier
103 Reception section
104 Delay adjustment section
104a Shift-register selector
104b Interpolation filter
104c, 104d Power computing section
104e Sample timing generation section
105 Sequencer

The invention claimed is:

1. A distortion compensation apparatus that compensates for distortion of an output signal from a circuit for modulating and amplifying an input signal, the distortion compensation apparatus comprising:
a demodulation section that acquires the output signal, and generates a demodulation signal by demodulating the output signal;
a delay adjustment section that computes a delay amount of the demodulation signal with respect to the input signal, adjusts a delay of the demodulation signal with respect to the input signal based on the delay amount, and outputs an delay adjusted input signal and a delay adjusted demodulation signal;
a distortion compensation section that determines a distortion compensation coefficient in an adaptive digital predistortion process based on the delay adjusted input signal and the delay adjusted demodulation signal; and
a multiplication section that multiplies the input signal by the distortion compensation coefficient determined by the distortion compensation section,
wherein the distortion compensation section corrects a phase shift caused by phase rotation between the delay adjusted input signal and the delay adjusted demodulation signal, and determines the distortion compensation coefficient based on a phase shifted input signal and a phase shifted demodulation signal in which the phase shift is corrected.

2. The distortion compensation apparatus according to claim 1, wherein the delay adjustment section includes:
a first delaying section that delays the input signal;
a second delaying section that delays the demodulation signal; and
a delay elimination section that eliminates the delay by detecting an output power of a delayed input signal from the first delaying section and an output power of a delayed demodulation signal output from the second delaying section, and by adaptively controlling a delay amount in the first delaying section and a delay amount in the second delaying section based on a difference between the output power of the delayed input signal and the output power of the delayed demodulation signal.

3. The distortion compensation apparatus according to claim 1, wherein the delay adjustment section includes:
a first delaying section that delays the input signal;
a second delaying section that delays the demodulation signal; and
a delay elimination section that eliminates the delay by detecting an amplitude of a delayed input signal from the first delaying section and an amplitude of a delayed demodulation signal output from the second delaying section, and by adaptively controlling a delay amount in the first delaying section and a delay amount in the second delaying section based on a difference between the amplitude of the delayed input signal and the amplitude of the delayed demodulation signal.

4. The distortion compensation apparatus according to claim 1, wherein, when correction of the phase shift caused by the phase rotation is performed by a convergence calculation using an iteration method, the distortion compensation section determines an initial value of the convergence calculation based on a polarity of an in-phase component of the delay adjusted input signal, a polarity of an quadrature component of the delay adjusted input signal, a polarity of an in-phase component of the delay adjusted demodulation signal, and a polarity of an quadrature component of the delay adjusted demodulation signal.

5. The distortion compensation apparatus according to claim 1, wherein the distortion compensation section determines the distortion compensation coefficient after the delay adjusted input signal and the delay adjusted demodulation signal transition to a steady state.

6. The distortion compensation apparatus according to claim 1, wherein when the distortion compensation apparatus is activated, the delay adjustment section starts a process of eliminating the delay, and outputs the delay adjusted input signal and the delay adjusted demodulation signal.

7. A distortion compensation method of compensating for distortion of an output signal from a circuit for modulating and amplifying an input signal, the method comprising:
acquiring the output signal to generate a demodulation signal by demodulating the output signal;
computing a delay amount of the demodulation signal with respect to the input signal to adjust a delay of the demodulation signal with respect to the input signal based on the delay amount, and to output an delay adjusted input signal and a delay adjusted demodulation signal;
correcting a phase shift caused by phase rotation between the delay adjusted input signal and the delay adjusted demodulation signal to determine distortion compensation coefficient in an adaptive digital predistortion process based on the delay adjusted input signal and the delay adjusted demodulation signal; and multiplying the input signal by the distortion compensation coefficient.

* * * * *